(12) United States Patent
Meier

(10) Patent No.: US 11,909,383 B2
(45) Date of Patent: Feb. 20, 2024

(54) ELECTRICAL CIRCUIT FOR TRANSMITTING A USEFUL ANALOGUE SIGNAL, WITH A SWITCH AND A COMPENSATION CIRCUIT FOR COMPENSATING SIGNAL DISTORTIONS WHEN THE SWITCH IS SWITCHED OFF

(71) Applicant: Thomas Meier, Starnberg (DE)

(72) Inventor: Thomas Meier, Starnberg (DE)

(*) Notice: Subject to any disclaimer, the term of this patent is extended or adjusted under 35 U.S.C. 154(b) by 0 days.

(21) Appl. No.: 17/624,085

(22) PCT Filed: Jun. 18, 2020

(86) PCT No.: PCT/EP2020/066960
§ 371 (c)(1),
(2) Date: Dec. 30, 2021

(87) PCT Pub. No.: WO2021/001161
PCT Pub. Date: Jul. 1, 2021

(65) Prior Publication Data
US 2022/0360261 A1    Nov. 10, 2022

(30) Foreign Application Priority Data
Jul. 1, 2019 (DE) .................... 10 2019 117 735.9

(51) Int. Cl.
*H03K 17/16* (2006.01)
*H03K 17/687* (2006.01)
(Continued)

(52) U.S. Cl.
CPC .......... *H03K 17/162* (2013.01); *H03K 17/063* (2013.01); *H03K 17/687* (2013.01); *H04B 3/06* (2013.01); *H03K 2217/0054* (2013.01)

(58) Field of Classification Search
None
See application file for complete search history.

(56) References Cited

U.S. PATENT DOCUMENTS

| 5,038,113 A | 8/1991 | Katz et al. |
| 8,786,002 B2 * | 7/2014 | Kondo .................... H01L 29/93 |
| | | 257/E29.345 |

(Continued)

FOREIGN PATENT DOCUMENTS

| DE | 4037292 A1 | 6/1991 |
| DE | 4239551 A1 | 6/1993 |

OTHER PUBLICATIONS

International Search Report for Application No. PCT /EP2020/ 066960 dated Aug. 24, 2020.

*Primary Examiner* — Kenneth B Wells
(74) *Attorney, Agent, or Firm* — Carter, DeLuca & Farrell LLP

(57) ABSTRACT

The invention relates to an electrical circuit (1) for transmitting a useful analogue signal, which has a signal transmission path (16) with an input path (2) and an output path (3) and at least one switch (6), with which the useful signal which is carried on the input path (2) can be connected through to the output path (3) or the signal transmission path (16) can be interrupted. According to the invention, a compensation circuit (4) which substantially compensates for a distortion of the useful analogue useful signal generated by the at least one switch (6) when it is switched off (OFF) is provided, wherein the compensation circuit (4) is connected to a control terminal (G) of the at least one switch (6) and comprises at least one non-linear capacitance.

5 Claims, 5 Drawing Sheets

(51) Int. Cl.
*H03K 17/06* (2006.01)
*H04B 3/06* (2006.01)

(56) References Cited

U.S. PATENT DOCUMENTS

| | | | |
|---|---|---|---|
| 9,685,908 B1* | 6/2017 | Lee | H03B 5/1253 |
| 2014/0302797 A1* | 10/2014 | Han | H04W 24/06 |
| | | | 455/67.14 |
| 2016/0179124 A1* | 6/2016 | Madan | G05F 3/262 |
| | | | 327/541 |
| 2017/0170822 A1* | 6/2017 | Cook | H01G 5/38 |
| 2017/0244361 A1* | 8/2017 | Farazian | H03B 5/1212 |
| 2017/0272066 A1 | 9/2017 | Scott et al. | |

* cited by examiner

ELECTRICAL CIRCUIT FOR TRANSMITTING A USEFUL ANALOGUE SIGNAL, WITH A SWITCH AND A COMPENSATION CIRCUIT FOR COMPENSATING SIGNAL DISTORTIONS WHEN THE SWITCH IS SWITCHED OFF

FIELD OF THE INVENTION

The invention relates to an electrical circuit for transmitting a useful analogue signal on a signal transmission path, in which one or more switches are arranged, with which the useful signal carried on the input path can be connected through to the output path.

Electrical circuits, to which reference is made in the following, are used in the field of mobile telecommunications for transmitting a useful analogue signal from an input to an output or for separating the output from the signal source. The useful signal is typically a high-frequency modulated signal, which for example contains speech or image data.

The switches used are as a rule analogue switches, e.g. field-effect transistors, because in particular they offer small transmission losses, rapid switching and high isolation of the switched-off path. However, diodes, in particular PIN diodes, are also used. By applying a control voltage (for the field-effect transistor) or a control current (for the PIN diode), the switch is brought into the high-resistance or low-resistance part of the characteristic.

FIG. 1 shows as an example an electrical circuit 1 known from the prior art for transmitting a useful analogue signal, which is generated by a signal source 13 (shown schematically), e.g. a transmitter-receiver (transceiver) and is transmitted to an electrical load 11, e.g. an antenna, shown at the output (on the right in the figure). The useful analogue signal may be for example a high-frequency, modulated signal, which for example contains speech or image data.

The electrical circuit 1 has various signal transmission paths 16, which are provided for transmitting useful signals in different frequency bands. Each signal transmission path 16 comprises an input path 2 and an output path 3. The circuit 1 is configured for bidirectional signal transmission, and therefore both paths may be dependent on the operating mode either of the input path or of the output path. In the transmit mode, the path shown on the left in the figure is the input path 2 and the path on the right is the output path 3; in the receive mode it is the other way around.

Each signal transmission path 16 comprises a switch 6, by means of which the useful signal that is on the input path 2 can be connected through to the output path 3 (in the transmit mode for example from left to right) or by means of which the input path 2 can be decoupled from the output path 3. To connect the useful analogue signal through to the output, the switch 6 is brought into the low-resistance state (ON). For separating the input path 2 from the output path 3, the switch 6 is brought into the high-resistance state (OFF).

The aforementioned switch 6 may be for example a transistor, such as e.g. a field-effect transistor or a diode, in particular a PIN diode. A series connection of several transistors or diodes may also be provided as switch 6 instead of an individual transistor or an individual diode, depending on the power to be transmitted. If said switch 6 is in the high-resistance state, i.e. switched-off state, it essentially represents a non-linear capacitance C. In the switched-on state (ON), the switch 6 acts essentially as a resistance R.

In the switched-off state (OFF), known field-effect transistors have a capacitance characteristic as shown for example in FIG. 2. FIG. 2 shows the variation of the capacitance $C_{OFF}$ of a field-effect transistor vs the drain-source voltage $V_{DS}$, which here for example has a curvature to the left, but characteristics with curvature to the right are also possible (dashed line). Owing to the non-linear characteristic, in the switched-off state (OFF) the field-effect transistor produces a distortion, which superimposes the useful signal transmitted on another signal transmission path 16. The useful analogue signal is distorted thereby, which has a negative effect on the transmission quality. The same also applies in the case of PIN diodes as switch 6.

OBJECT OF THE INVENTION

Therefore an object of the present invention is to provide an electrical circuit for transmitting a useful analogue signal on a signal transmission path, which comprises an input path and an output path, which can be electrically connected or separated from one another by means of at least one switch, wherein, in the switched-off state of the at least one switch, the electrical circuit causes considerably less distortion of the useful analogue signal.

This object is achieved according to the invention by the features presented in claim 1. Further embodiments of the invention are the subject of dependent claims.

According to the invention, an electrical circuit for transmitting a useful analogue signal on a signal transmission path is proposed, which has one or more switches, with which the useful signal that is carried on an input path can be connected through to an output path. According to the invention, the electrical circuit comprises a compensation circuit, which substantially compensates distortion of the useful analogue signal produced by the at least one switch in the switched-off state (OFF), wherein the compensation circuit is connected to a control connection of the at least one switch and comprises at least one non-linear capacitance.

As described above, for example transistors, in particular FET transistors, or diodes, in particular PIN diodes, may be used as switches.

The electrical circuit according to the invention preferably comprises several signal transmission paths, which are provided for transmitting useful signals in various frequency bands. In this case each signal transmission path preferably comprises at least one switch for connecting-through or interrupting the signal transmission path.

According to a first embodiment of the invention, the non-linear capacitance contained in the compensation circuit comprises one or more varactors or one or more transistors, in particular FETs.

The non-linear capacitance may for example be connected via a capacitor to the control connection (e.g. gate) of the at least one switch.

According to a preferred embodiment of the invention, the compensation circuit comprises several series-connected varactors or transistors.

The aforementioned switches may basically be configured as an individual element or as a series connection of several elements, e.g. several series-connected transistors or diodes. In the case of series connection, optionally a separate compensation circuit may be connected to each control connection of the individual elements. However, a single compensation circuit may also be connected to the control connections of the elements, which is assigned to all elements in common.

The compensation circuit according to the invention may also comprise any combination of the aforementioned embodiments.

According to a special embodiment of the invention, the electrical circuit comprises several input paths and several output paths, which may optionally be connected to one another electrically or separated from one another by means of switches. In each possible signal transmission path, at least one switch is provided, so that the useful signal that is being carried on one of the input paths may be connected through to any one of the output paths. In such an embodiment, preferably at least one compensation circuit is provided for each possible signal transmission path.

BRIEF DESCRIPTION OF THE DRAWINGS

The invention is explained in more detail below with examples, referring to the appended drawings. These show.

DETAILED DESCRIPTION OF PREFERRED EMBODIMENTS

Figure 1:
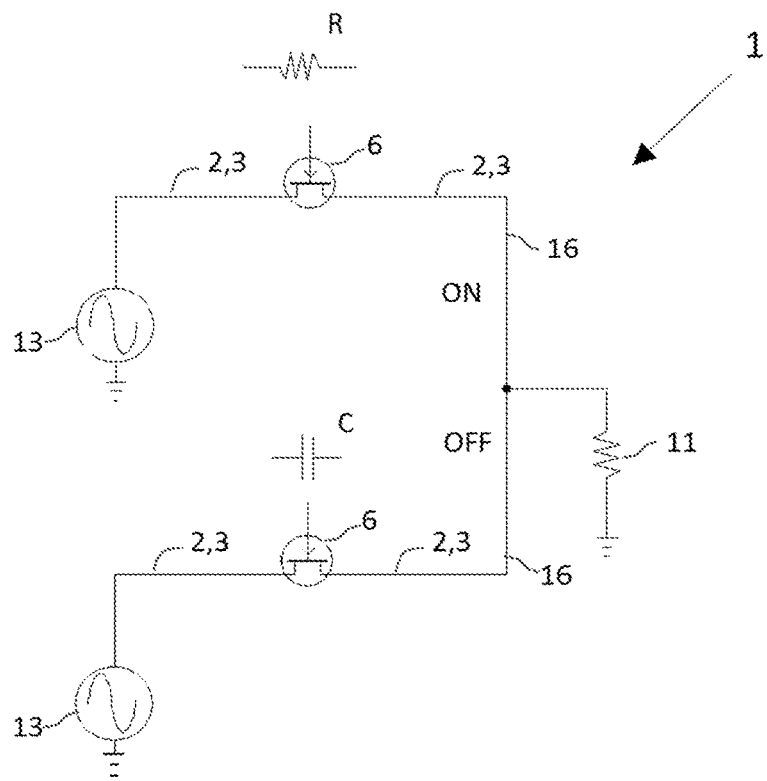
FIG. 1, an electrical circuit known from the prior art for transmitting a useful analogue signal in a mobile terminal device, with a compensation circuit for compensating distortions in the useful signal.
Figure 2:
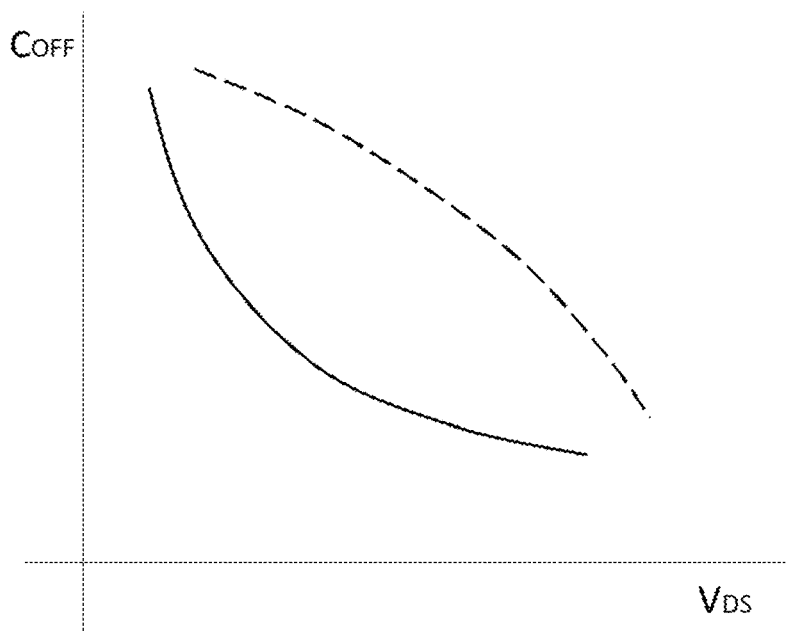
FIG. 2, capacitance characteristics of known field-effect transistors.

Regarding the explanation for FIGS. 1 and 2, reference should be made to the introduction of the description.

Figure 3:
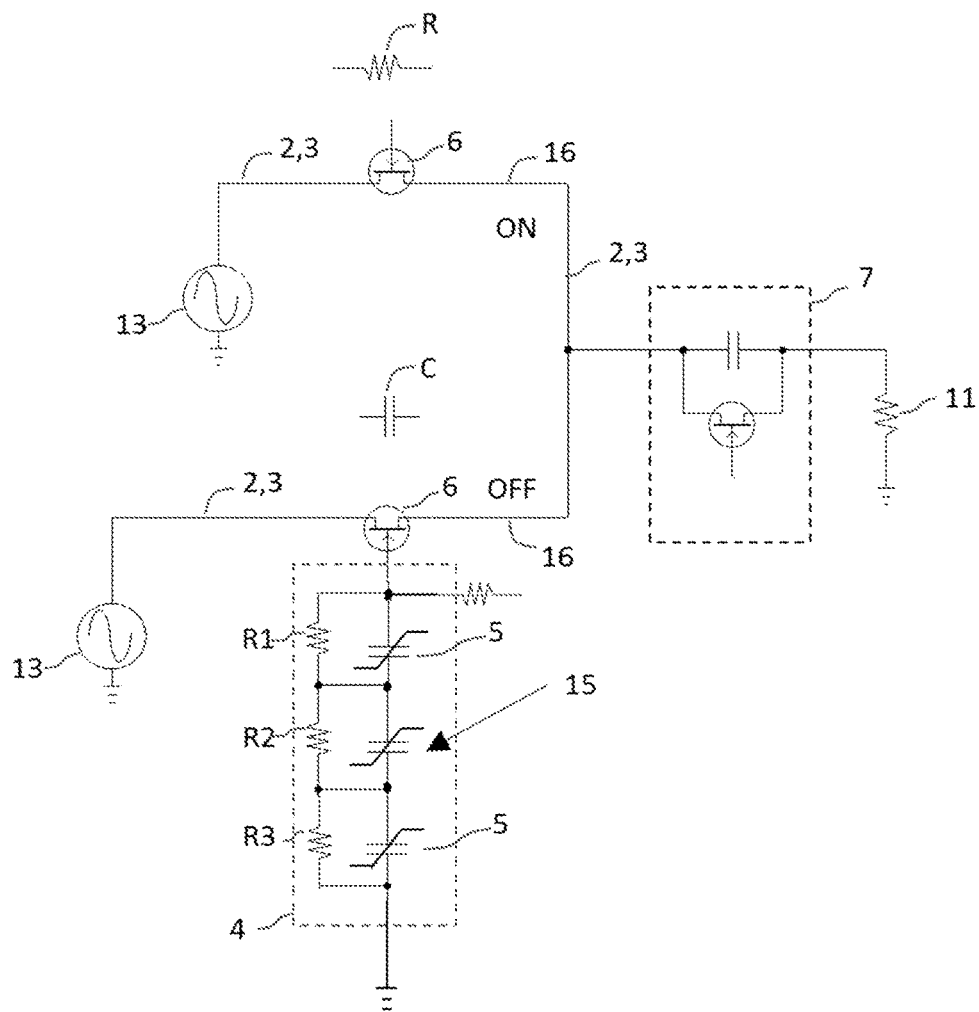
FIG. 3, an electrical circuit for transmitting a useful analogue signal with a compensation circuit according to a first embodiment of the invention.

FIG. 3 shows an electrical circuit 1 for transmitting a useful analogue signal according to a first embodiment of the invention. The switch in FIG. 3 is configured substantially identically to the switch in FIG. 1. To avoid repetition, reference should therefore be made to the description for FIG. 1. Identical elements are designated with the same reference symbol.

Compared to FIG. 1, the switch in FIG. 3 additionally comprises a compensation circuit 4, which substantially compensates a distortion of the useful analogue signal produced by the switch 6 in the switched-off state (OFF). For this purpose the compensation circuit 4 comprises at least one non-linear capacitance 15, which is connected to a control connection (gate G) of the switch 6.

In the embodiment example shown, the non-linear capacitance 15 comprises several series-connected varactors 5. A resistance R1-R3 is parallel-connected to each varactor 5.

The whole compensation circuit 4 is moreover connected to a reference potential, here ground.

The switch 6 arranged in the upper signal transmission path 16 also comprises a compensation circuit 4 of this kind with a non-linear capacitance 15 (not shown), so that the signal distortion caused by this switch 6 in the switched-off state (OFF) can also be compensated.

The circuit 1 in FIG. 3 additionally contains a second compensation circuit 7, which compensates a distortion of the useful analogue signal produced by the switches 6 in the switched-on state (ON). This compensation circuit 7 is described in DE 10 2016 121 865 A1 and in PCT/EP2017/076986, to which reference is made here in their entirety.

Figure 4:
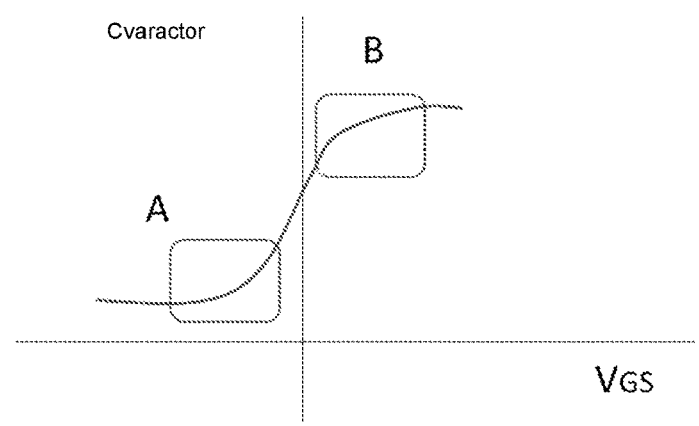
FIG. 4, a capacitance characteristic of a known varactor.

FIG. 4 shows the capacitance characteristic of a non-linear capacitance 15 as a function of the control voltage $V_{GS}$ and the regions A or B of the characteristic that are used. The curvature of the characteristic is opposite to the curvature of the capacitance characteristic of the switch 6. Thus, region A or B of the characteristic of the varactor is used depending on the curvature of the characteristic of the switch 6. The opposite curvature produces a distortion shifted by 180 degrees, so that with optimal dimensioning, the distortion due to the switch 6 in the OFF state can substantially be compensated.

Figure 5:
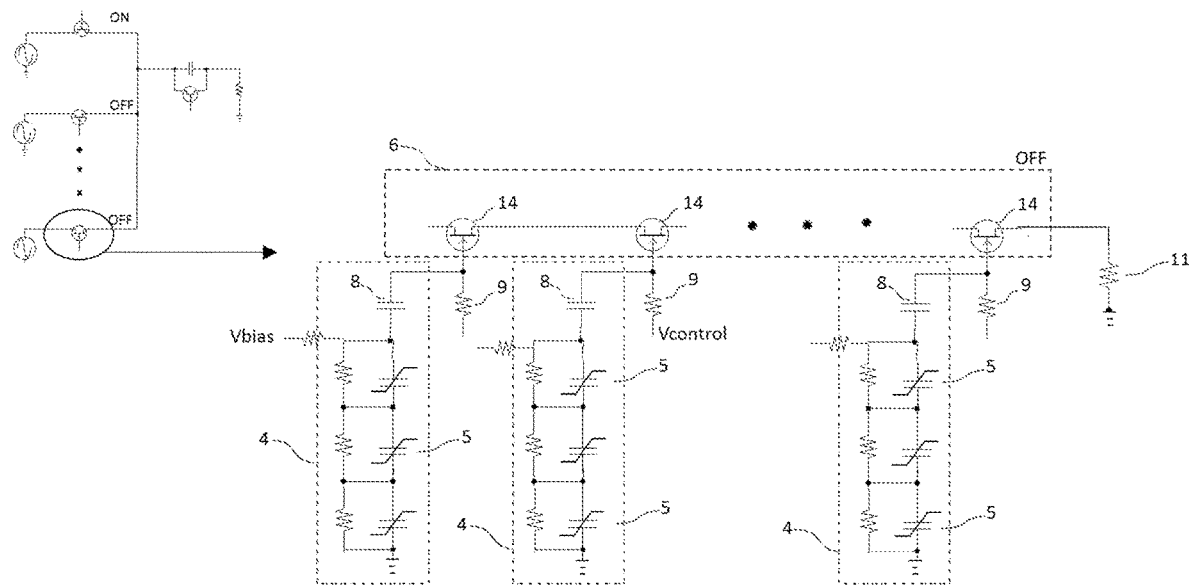
FIG. 5, an electrical circuit for transmitting a useful analogue signal with a compensation circuit according to the first embodiment of the invention.

Depending on the signal power to be transmitted and linearity requirements, the switches 6 are typically configured not as individual elements, but as a series connection of several elements, e.g. several transistors or diodes. FIG. 5 shows an electrical circuit 1 of this kind for transmitting a useful analogue signal, for which the switches 6 are in each case configured as a series connection of several transistors 14. Each transistor 14 has a control connection G, to which in each case one compensation circuit 4 is connected. In the case of N transistors 14, there are accordingly N compensation circuits 4. The individual compensation circuits 4 comprise in each case several series-connected varactors 5, as described above.

The compensation circuits 4 are in each case connected via a coupling capacitor 8 to the control connection G of the respective transistor 14. A control line with a resistance 9, by which the respective transistor 14 is controlled, is also connected to each transistor 14.

Figure 6:
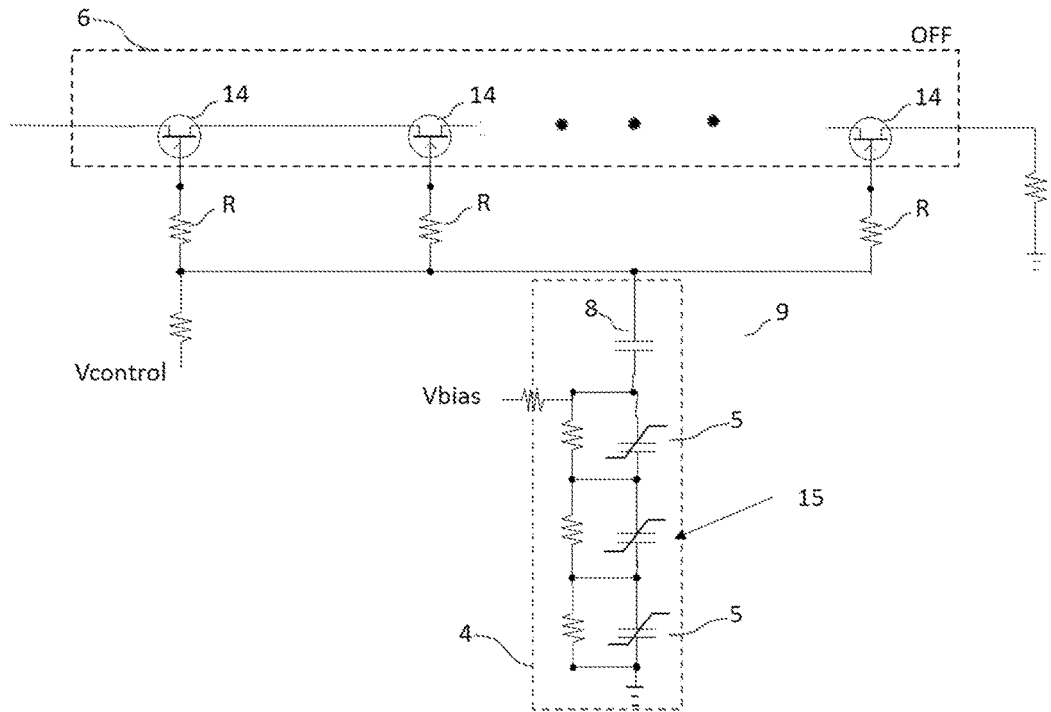
FIG. 6, an electrical circuit for transmitting a useful analogue signal with a compensation circuit according to the first embodiment of the invention.

Instead of assigning each of the transistors 14 its own compensation circuit 4, it is also possible to provide a single compensation circuit 4, which is assigned to all transistors 14 in common. This is shown in FIG. 6. As can be seen, the compensation circuit 4 is connected to all control connections G of the transistors 14 via one resistance R in each case.

Figure 7:
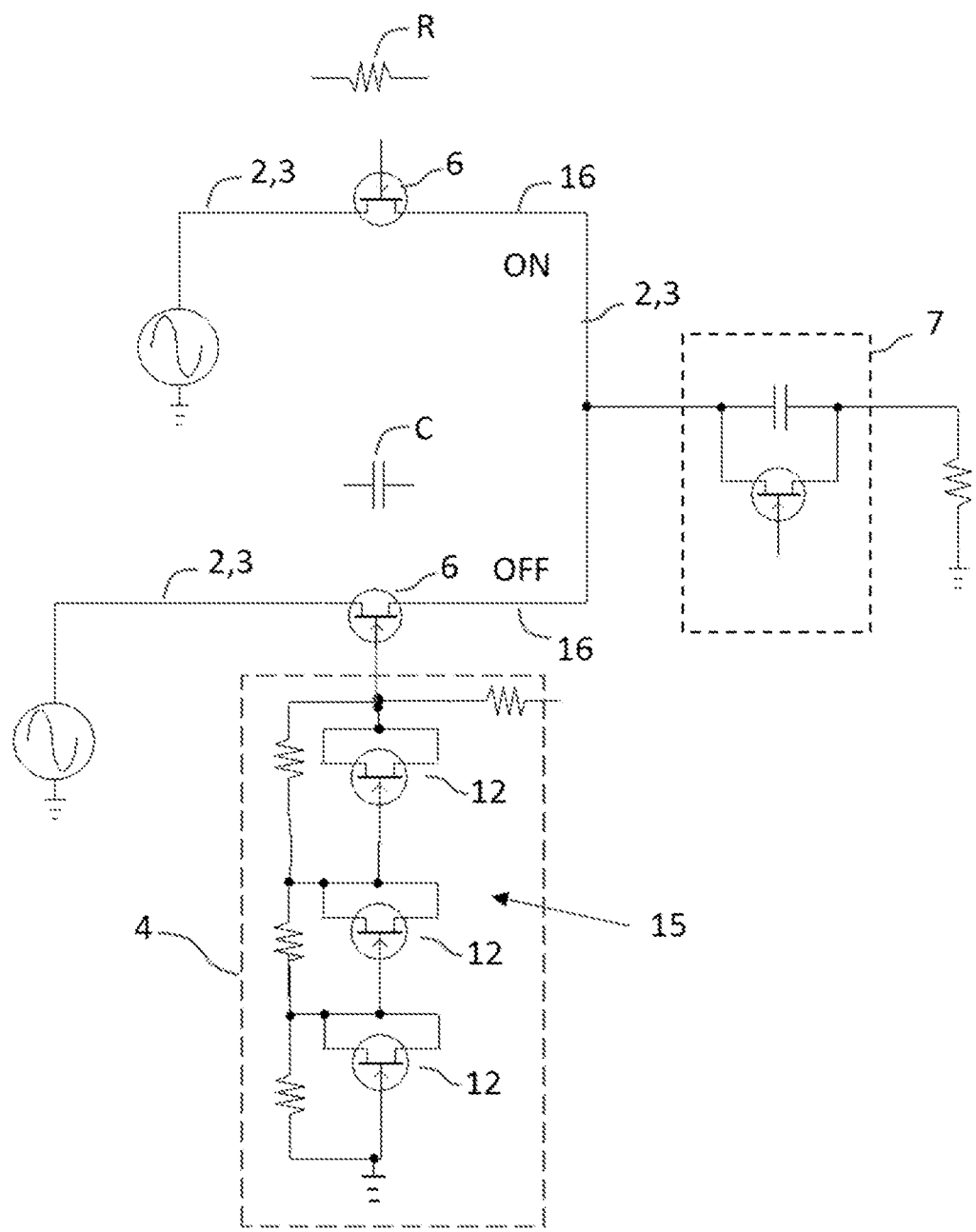
FIG. 7, an electrical circuit for transmitting a useful analogue signal with a compensation circuit according to a second embodiment of the invention.

FIG. 7 shows an electrical circuit 1 for transmitting a useful analogue signal, which is configured substantially identically to circuit 1 in FIG. 3. To avoid repetition, reference should therefore be made to the description for FIG. 3.

The circuit 1 in FIG. 7 contains a compensation circuit 4 according to a second embodiment of the invention. Instead of varactors 5, the compensation circuit 4 comprises in this case several series-connected transistors 12. The individual transistors 12 produce once again an interference signal, which is opposite to the distortion produced by the switches 6 and substantially compensates it. The compensation circuit 4 of the upper switch 6 is once again not shown, for the sake of clarity.

Figure 8:
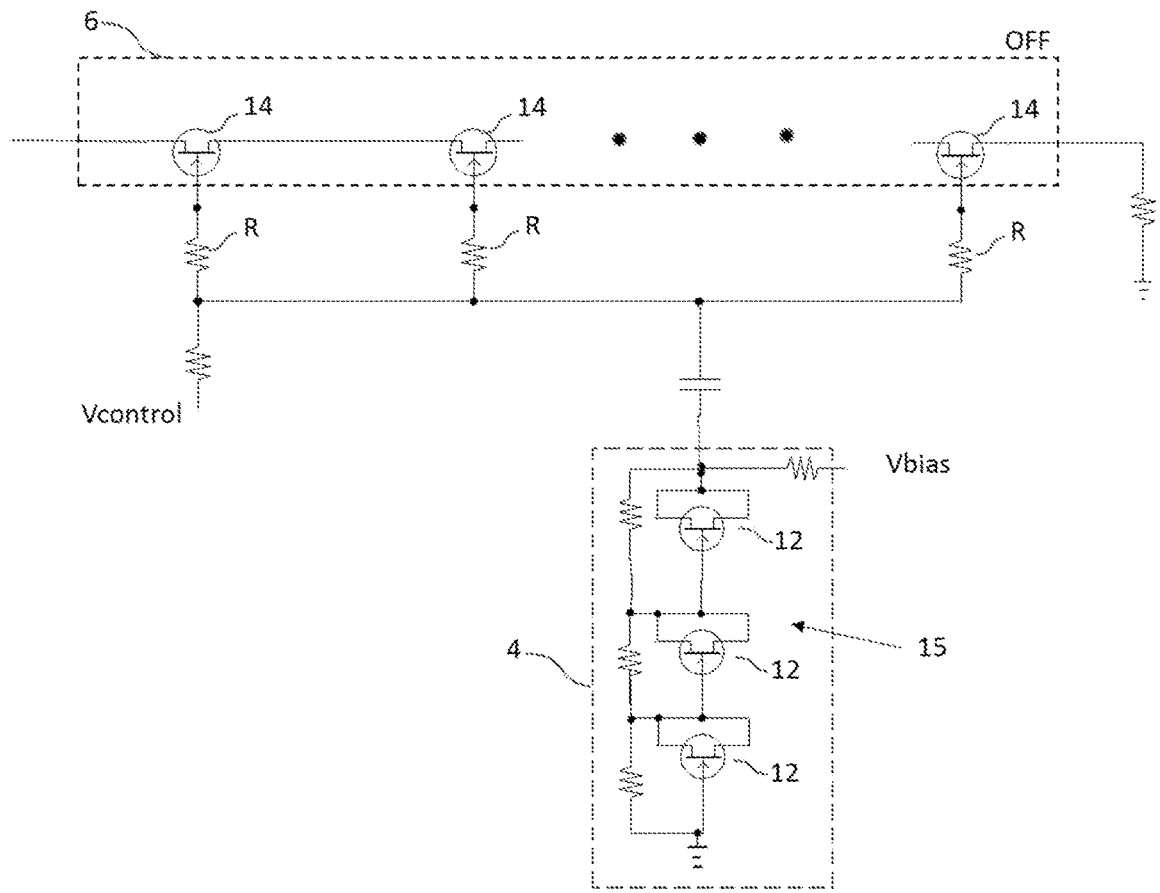
FIG. 8, an electrical circuit for transmitting a useful analogue signal with a compensation circuit according to the second embodiment of the invention.

FIG. 8 finally shows yet another electrical circuit 1, in which the switches 6 are in each case configured as a series connection of several transistors 14. On the control connections G of the individual transistors 14, a single compensation circuit 4 is provided, which is assigned jointly to all transistors 14. The compensation circuit 4 comprises several series-connected transistors 12 according to the second embodiment of the invention.

Figure 9:
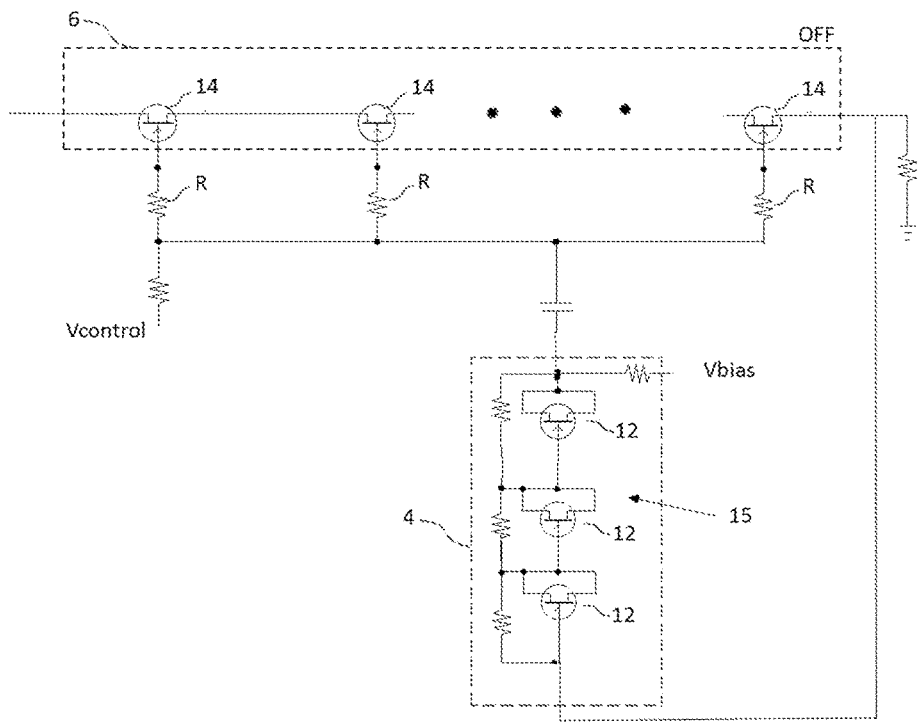
FIG. 9, an electrical circuit for transmitting a useful analogue signal with a compensation circuit according to the second embodiment of the invention.

FIG. 9 shows a modification of the circuit from FIG. 8, wherein in this case the compensation circuit is not switched against a fixed potential (ground), but is connected to the output of switch 6. This modification may be applied correspondingly to the circuits in FIGS. 5, 6 and 7.

The invention claimed is:

1. An electrical circuit for transmitting a useful analogue signal, which has a signal transmission path with an input path and an output path wherein, in the signal transmission path, several two or more switches arranged in series are provided, which in each case have a control connection, and with which the useful analogue signal that is carried on the input path can be connected through to the output path or the signal transmission path can be interrupted, the switches in the switched-off state having a capacitance characteristic with a given curvature, wherein the electrical circuit further comprises a compensation circuit assigned jointly for the series of switches which substantially compensates a distortion of the useful analogue signal produced by the series of switches in the switched-off state (OFF) and wherein the compensation circuit comprises at least one non-linear capacitance having a capacitance characteristic with a given curvature, which is connected via a capacitor to the control connections of each of the series of switches, wherein the at least one non-linear capacitance is operated at a region of its capacitance characteristic at which its curvature is opposite to that of the capacitance characteristic of the series of switches in the switched-off state.

2. The electrical circuit as claimed in claim 1, wherein the non-linear capacitance comprises one or more varactors.

3. The electrical circuit as claimed in claim 1, wherein the non-linear capacitance comprises one or more MOSFETs.

4. The electrical circuit as claimed in claim 1, wherein the compensation circuit comprises several varactors or several transistors, which are connected in series.

5. An electrical circuit for transmitting a useful analogue signal, which has a signal transmission path with an input path and an output path wherein a compensation circuit assigned jointly for a plurality of switches arranged in series is connected to the control connections of the switches and with which the useful analogue signal that is carried on the input path can be connected through to the output path or the signal transmission path can be interrupted, the plurality of switches in the switched-off state having a capacitance characteristic with a given curvature, wherein the electrical circuit further comprises a compensation circuit which substantially compensates a distortion of the useful analogue signal produced by the at least one switch of the plurality of switches in the switched-off state (OFF) and wherein the compensation circuit comprises at least one non-linear capacitance having a capacitance characteristic with a given curvature, which is connected via a capacitor to the control connection of each of the at least one switch of the plurality of switches, wherein the at least one non-linear capacitance is operated at a region of its capacitance characteristic at which its curvature is opposite to that of the capacitance characteristic of the at least one switch of the plurality of switches in the switched-off state, wherein, in the signal transmission path, two or more switches of the plurality of switches arranged in series are provided, which in each case have a control connection, wherein a compensation circuit assigned jointly for the plurality of switches arranged in series is connected to the control connections of the plurality of switches.

* * * * *